(12) United States Patent (10) Patent No.: US 8,692,749 B2
Matsumoto et al. (45) Date of Patent: Apr. 8, 2014

(54) DISPLAY APPARATUS WITH CONTINUOUS SEMICONDUCTOR LAYER

(75) Inventors: Shoichiro Matsumoto, Gifu (JP); Yasunori Kinpara, Osaka (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 13/613,113

(22) Filed: Sep. 13, 2012

(65) Prior Publication Data

US 2013/0001569 A1 Jan. 3, 2013

Related U.S. Application Data

(63) Continuation of application No. 11/580,668, filed on Oct. 13, 2006, now Pat. No. 8,289,235.

(30) Foreign Application Priority Data

Oct. 19, 2005 (JP) ................................ 2005-304911

(51) Int. Cl.
*G09G 3/32* (2006.01)

(52) U.S. Cl.
USPC .......................................................... 345/82

(58) Field of Classification Search
USPC ..................................... 345/76, 82
See application file for complete search history.

(56) References Cited

U.S. PATENT DOCUMENTS

| | | | |
|---|---|---|---|
| 2003/0090447 A1 | 5/2003 | Kimura | |
| 2003/0132896 A1 | 7/2003 | Matsueda | |
| 2004/0056257 A1 | 3/2004 | Sakamoto et al. | |
| 2004/0080474 A1 | 4/2004 | Kimura | |
| 2004/0145547 A1 | 7/2004 | Oh | |
| 2004/0239599 A1 | 12/2004 | Koyama | |
| 2005/0093789 A1 | 5/2005 | Kim et al. | |
| 2005/0094038 A1 | 5/2005 | Choi et al. | |
| 2005/0110730 A1 | 5/2005 | Kim et al. | |
| 2005/0140600 A1 | 6/2005 | Kim et al. | |
| 2005/0206593 A1 | 9/2005 | Kwon | |
| 2005/0212446 A1 | 9/2005 | Eom | |
| 2005/0243036 A1 | 11/2005 | Ikeda | |
| 2005/0264228 A1 | 12/2005 | Kim | |
| 2006/0066254 A1 | 3/2006 | Sasaki et al. | |

FOREIGN PATENT DOCUMENTS

| | | |
|---|---|---|
| JP | 2002-514320 A | 5/2002 |
| JP | 2003-223138 A | 8/2003 |
| JP | 2004-4348 A | 1/2004 |
| JP | 2005-128521 A | 5/2005 |

(Continued)

OTHER PUBLICATIONS

Japanse Office Action, Notice of Grounds for Rejection for Japanse Patent Application No. 2005-304911 with English Translation, Date: Aug. 16, 2011.

(Continued)

*Primary Examiner* — Long D Pham
(74) *Attorney, Agent, or Firm* — Cantor Colburn LLP (57) ABSTRACT

A capacitance setting line is disposed at the top end of a pixel, a light emission setting line is disposed at the bottom end of the pixel, and a gate line is disposed at the center between both the lines. A selection transistor, a potential control transistor and a capacitor are disposed between the gate line and a capacitance setting line. A short-circuit transistor, a drive transistor and a drive control transistor are disposed between the gate line and the light emission setting line. With such an arrangement, the efficient arrangement of wiring contacts can be performed, and an aperture ratio can be increased.

8 Claims, 12 Drawing Sheets

(56) References Cited

FOREIGN PATENT DOCUMENTS

| | | | |
|---|---|---|---|
| JP | 2005-157308 A | 6/2005 | |
| JP | 2005326828 A | 11/2005 | |
| WO | 98/48403 A1 | 10/1998 | |
| WO | 03/027997 A1 | 4/2003 | |

OTHER PUBLICATIONS

US Non Final Office Action, for U.S. Appl. No. 14/069,877, dated Jan. 6, 2014; 10 pages.

PRIOR ART

DISPLAY APPARATUS WITH CONTINUOUS SEMICONDUCTOR LAYER

CROSS-REFERENCE TO RELATED APPLICATIONS

The present application is a continuation application of U.S. patent application Ser. No. 11/580,668, filed on Oct. 13, 2006, the entire contents of which are incorporated herein by reference. The Ser. No. 11/580,668 application claimed the benefit of the date of the earlier filed Japanese Patent Application No. JP 2005-304911, filed on Oct. 19, 2005.

BACKGROUND OF THE INVENTION

1. Field of the Invention

The present invention relates to a display apparatus including a light emitting device, and more particularly to a layout thereof.

2. Description of the Related Art

Organic EL panels using organic EL elements are conventionally known, and the development of such organic EL panels has been advancing. In organic EL panels, the organic EL elements are arranged in a matrix, and the light emission of each of the organic EL elements is individually controlled to perform display. In particular, in an active matrix type organic EL panel, each pixel includes a TFT for display control, and the light emission of each pixel can be controlled by the operation control of the TFT. Consequently, it is possible for the active matrix type organic EL panel to perform display with a very high accuracy.

Figure 12:
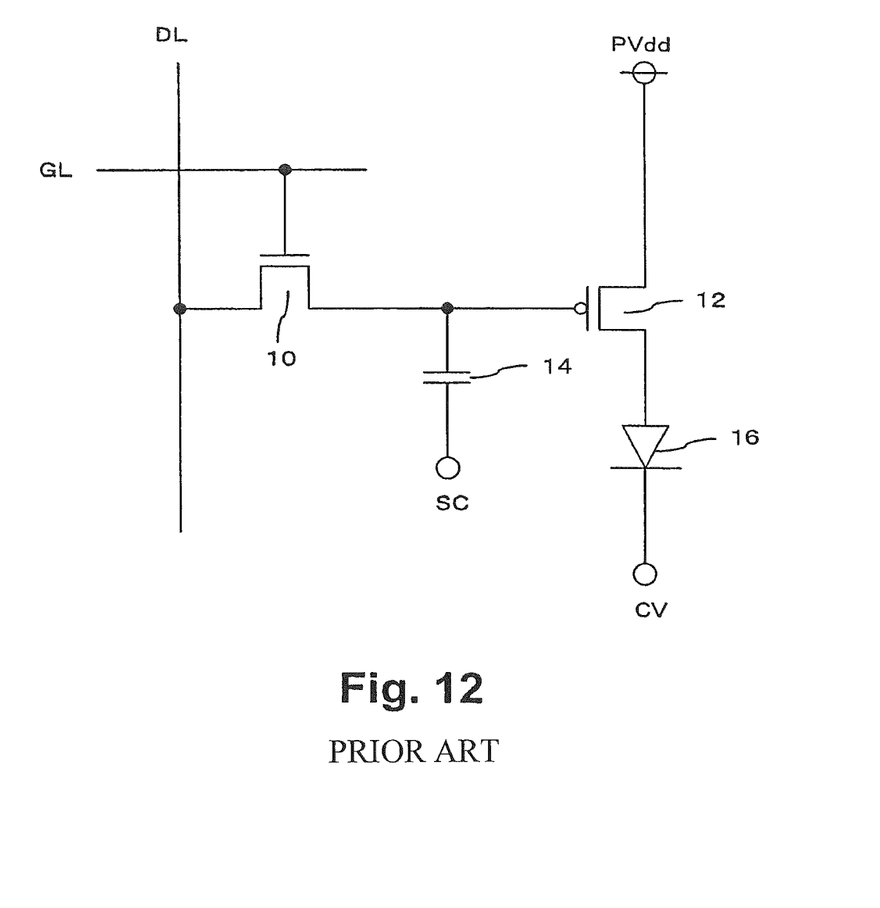
FIG. 12 is a diagram showing an example of a conventional pixel circuit.

FIG. 12 shows an example of a pixel circuit in the active matrix type organic EL panel. A data line DL, to which a data voltage expressing the luminance of a pixel is supplied, is connected to the gate of a drive TFT 12 through an n-channel selection TFT 10, the gate of which is connected to a gate line GL. Moreover, an end of a holding capacitor 14, the other end of which is connected to a capacitance line SC, is connected to the gate of the drive TFT 12 to maintain the gate voltage of the drive TFT 12.

The source of the drive TFT 12 is connected to an EL power supply line, and the drain thereof is connected to the anode of an organic EL element 16, the cathode of which is connected to a cathode power supply.

Such pixel circuits are arranged in a matrix, and a gate line provided to each horizontal line turns to an H level at predetermined timing to turn on the selection TFT's 10 on the line. In this state, because data voltages are sequentially supplied to the data lines, the data voltages are held by the holding capacities 14, and the data voltages at that time are held even if the gate line is turned to an L level.

The drive TFT's 12 operate according to the voltages held by the holding capacitors 14, and corresponding drive currents flow from the EL power supply to the cathode power supply through the organic EL elements 16. Thus, the organic EL elements 16 emit light according to the data voltages.

The gate lines are sequentially turned to the H level to supply input video signals to corresponding pixels as data voltages. As a result, the organic EL elements 16 arranged in the matrix emit light according to the data voltages to perform the display of the video signals.

Such pixel circuits have a problem in that display quality is lowered owing to the dispersion of luminance at the time of the dispersion of the threshold voltages of the drive TFT's of the pixel circuits arranged in the matrix. It is difficult to unify the characteristics of the TFT's constituting the pixel circuits of the whole display panel, and it is difficult to prevent the dispersion of the threshold values of the turning on and off of the TFT's.

Accordingly, for example, Published Japanese Translation of PCT Application No. 2002-514320, Japanese Patent Laid-Open Publication No. 2005-128521 and the like have proposed circuits for preventing the influence of the variations of the threshold values of TFT's.

However, these proposals need two or more control lines for the control of each pixel circuit. That is, the above-mentioned circuit shown in FIG. 12 needs only the gate line GL as the other control lines besides the data line DL and the power supply line, which extend in the vertical direction, to each pixel, but each of the pixel circuits disclosed in the above documents needs at least two control lines in addition to the gate line.

Consequently, these proposals have a problem in that not only the control lines but also connection lines to connect the control lines with transistors increase, which decreases the aperture ratio of the display apparatus.

Accordingly, it is desired to keep the aperture ratios at comparatively high values by arranging the wiring and the like efficiently.

SUMMARY OF THE INVENTION

According to the present invention, two control lines other than a gate line are arranged in parallel with the gate line so as to put the gate line between the two control lines. As a result, the wiring can be efficiently arranged, and the aperture ratio can be made comparatively large. At least one contact with a power supply line is preferably disposed in a space between the gate line and the control lines where no pixel electrodes exist.

DETAILED DESCRIPTION OF PREFERRED EMBODIMENT

In the following, an embodiment of the present invention will be described with reference to the attached drawings.

Figure 1:
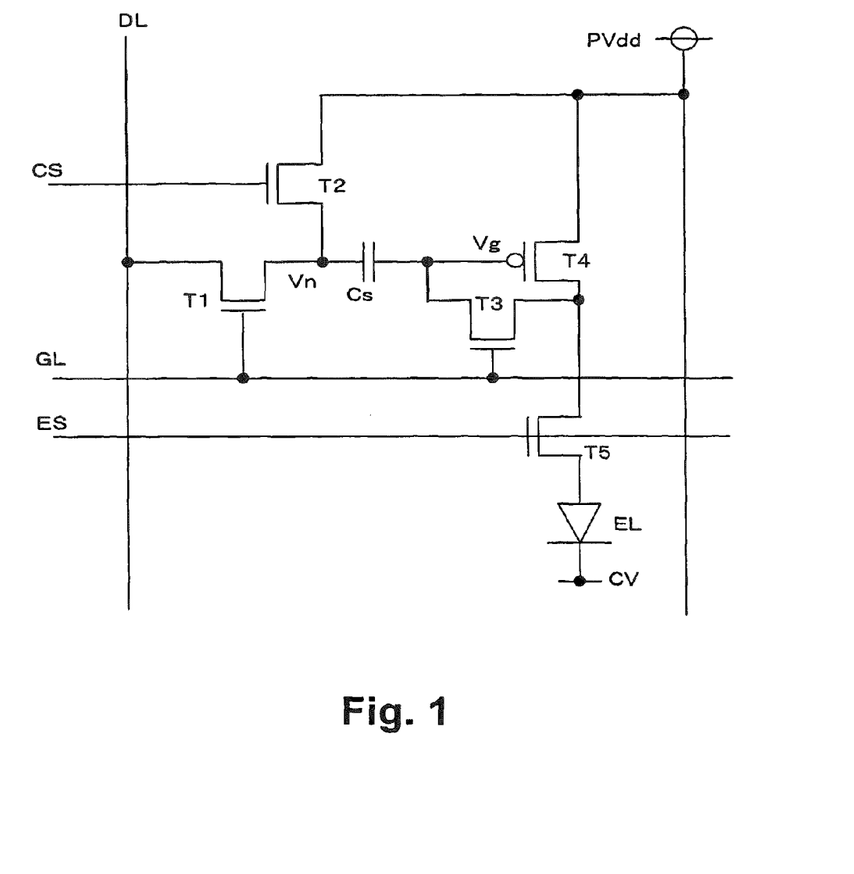
FIG. 1 is a diagram showing the configuration of a pixel circuit according to an embodiment.

FIG. 1 shows the configuration of a pixel circuit according to the embodiment. A data line DL extends in a vertical direction to supply a data signal (data voltage Vsig) pertaining to the display luminance of a pixel to the pixel circuit. One data line DL is provided to the pixels of one column, and sequentially supplies the data voltages Vsig to the pixels aligned in a vertical direction.

The drain of an n-channel selection transistor T1 is connected to the data line DL, and the source of the selection transistor T1 is connected to an end of a capacitor Cs. The gate of the selection transistor T1 is connected to a gate line GL extending in a horizontal direction.

Moreover, a capacitance setting line CS is provided to the pixels of one row, and the gate of a p-channel potential control transistor T2 is connected to the capacitance setting line CS. The capacitance setting line CS turns to an L level a little before the gate line GL turns to an H level, and returns to the H level after the gate line GL has returned to the L level. Consequently, basically the potential control transistor T2 is off when the selection transistor T1 is on, and the potential control transistor T2 is on when the selection transistor T1 is off. The source of the potential control transistor T2 is connected to a power supply line PVdd, and the drain thereof is connected to the capacitor Cs and the source of the selection transistor T1. In addition, also the power supply line PVdd extends in the vertical direction, and the power supply line PVdd supplies a power supply voltage PVdd to each pixel in the vertical direction.

The other end of the capacitor Cs is connected to the gate of a p-channel drive transistor T4. The source of the drive transistor T4 is connected to the power supply line PVdd, and the drain thereof is connected to the drain of an n-channel drive control transistor T5. The source of the drive control transistor T5 is connected to the anode of an organic EL element EL, and the gate thereof is connected to a light emission setting line ES extending in the horizontal direction. Moreover, the cathode of the organic EL element EL is connected to a low voltage cathode power supply CV.

Furthermore, the drain of an n-channel short-circuit transistor T3 is connected to the gate of the drive transistor T4, and the source of the short-circuit transistor T3 is connected to the drain of the drive transistor T4. Moreover, the gate of the short-circuit transistor T3 is connected to the gate line GL.

As mentioned above, in the present embodiment, two lines, namely the data line DL and the power supply line Pvdd, are disposed in the vertical direction, and two lines, namely the capacitance setting line CS and the light emission setting line ES, are disposed in the horizontal direction besides the gate line GL.

Next, the operation of the pixel circuit is described.

Figure 2:
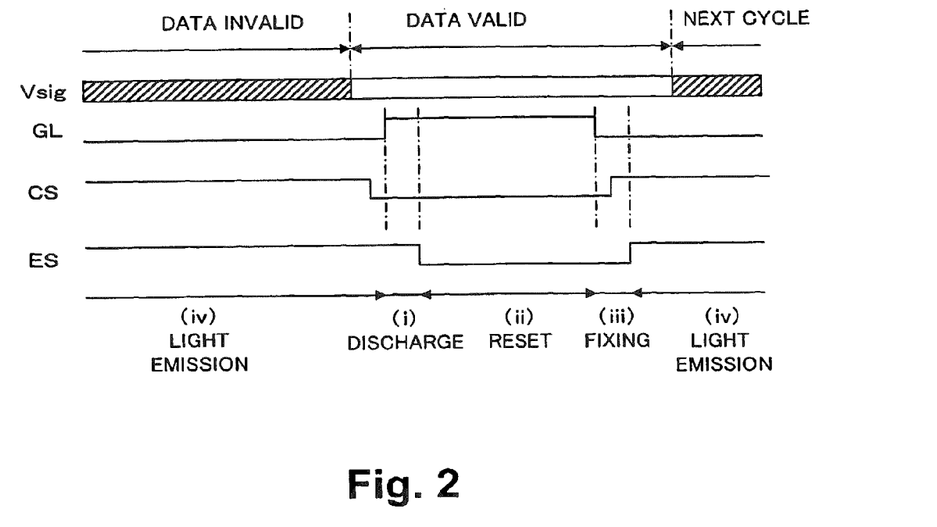
FIG. 2 is a chart diagram for illustrating operation.

As shown in FIG. 2, the pixel circuit takes the following four states according to the states (H level or L level) of the gate line GL, the capacitance setting line CS and the light emission setting line ES, and repeats the four states. The four states are (i) discharge (GL=H level, CS=L level, ES=H level), (ii) reset (GL=H level, CS=L level, ES=L level), (iii) potential fixation (GL=L level, CS=H level, ES=L level) and (iv) light emission (GL=L level, CS=H level, ES=H level). That is, in the state in which the data of the data line DL are valid, the pixel circuit performs (i) discharge, and determines the charging voltage of the capacity Cs by (ii) reset after that. In (iii), a gate voltage Vg is fixed, and in (iv) the organic EL element EL performs light emission as a result of a drive current according to the fixed gate voltage Vg. In addition, the capacitance setting line CS is at the L level when the gate line GL is at the H level, and is at the H level when the gate line GL is at the L level, as mentioned above. However, the capacitance setting line CS turns to the L level before the gate line GL turns to the H level, and turns to the H level after the gate line GL has turned to the L level. As a result, the selection transistor T1 and the potential control transistor T2 turning on at the same time is prevented.

Moreover, the data on the data line DL becomes valid before the (i) discharge process, and becomes invalid after the (iii) fixation process, as shown in the diagram. Consequently, the valid data is set on the data line DL from the (i) discharge process to the (iii) fixation process.

In the following, each state is described. In addition, a transistor being off is shown by a broken line in FIGS. 3-6.

(i) Discharge (GL=H level, CS=L level, ES=H level)

Figure 3:
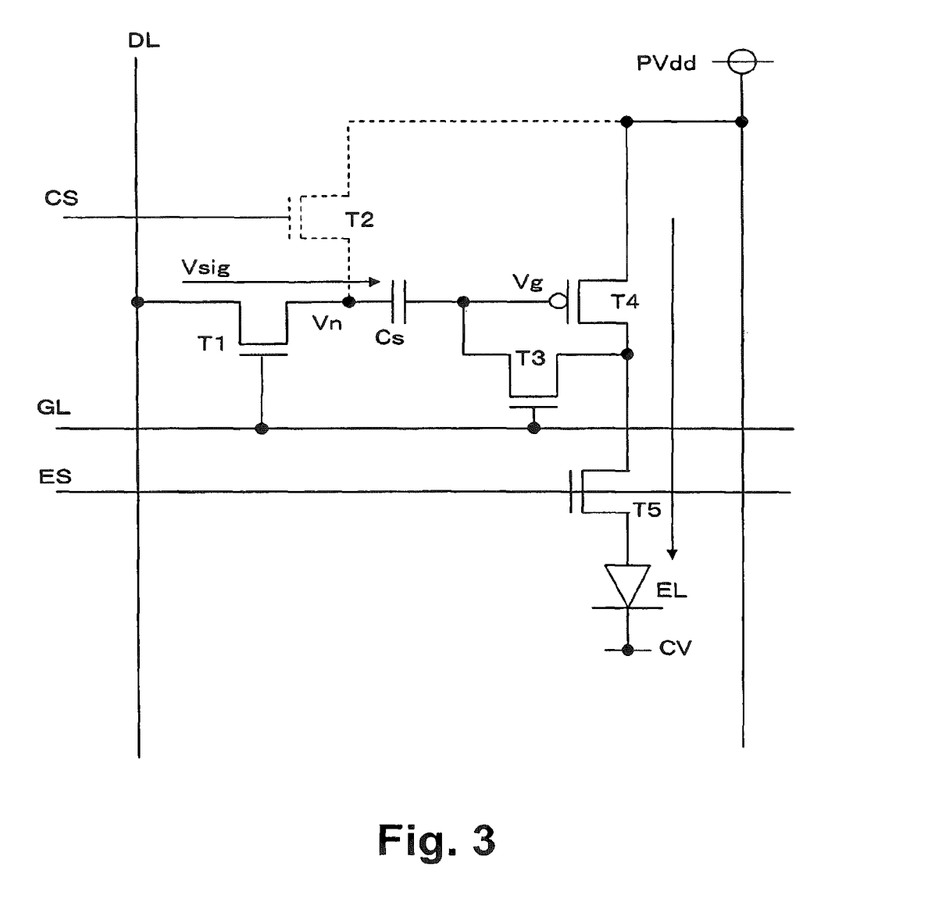
FIG. 3 is a diagram for illustrating a discharge process.

First, in the state in which the data voltage Vsig is supplied to the data line DL, both of the gate line GL and the light emission setting line ES are made to be at the H level (high level), and the capacitance setting line CS is made to be at the L level. As a result, the selection transistor T1, the drive control transistor T5 and the short-circuit transistor T3 turn on, and the potential control transistor T2 turns off. Consequently, as shown in FIG. 3, in the state in which a voltage Vn of the capacitor Cs on the selection transistor T1 side is equal to the voltage Vsig, a current from the power supply line PVdd flows into the cathode power supply CV through the drive transistor T4, the drive control transistor T5 and the organic EL element EL, and the charges held in the gate of the drive transistor T4 are thus extracted. Consequently, the gate voltage Vg of the drive transistor T4 becomes a predetermined low voltage.

(ii) Reset (GL=H level, CS=L level, ES=L level)

Figure 4:
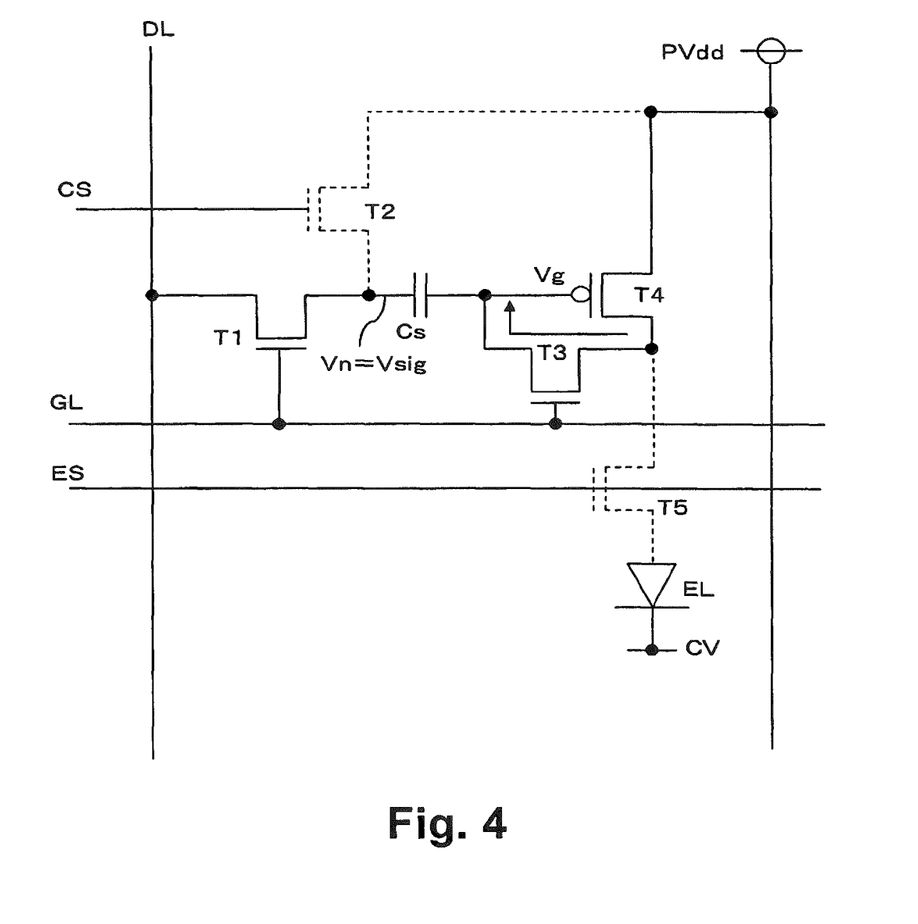
FIG. 4 is a diagram for illustrating a reset process.

From the above discharge state, the light emission setting line ES is changed to be at the L level (low level). Consequently, as shown in FIG. 4, the drive control transistor T5 turns off, and the gate voltage Vg of the drive transistor T4 is reset to a voltage Vg0 (=PVdd−|Vtp|), where the voltage Vtp is the threshold voltage of the drive transistor T4. That is, because the gate and the drain of the drive transistor T4 are short-circuited to each other by the short-circuit transistor T3 in the state in which the source of the drive transistor T4 is connected to the power supply PVdd, the gate voltage is set to a voltage lower than the power supply PVdd by the threshold voltage |Vtp| of the drive transistor T4, and then the drive transistor T4 is turned off. At this time, the potential Vn of the capacitor Cs on the selection transistor T1 side is the voltage Vsig, and a voltage of |Vsig−(PVdd−|Vtp|)| is charged into the capacitor Cs.

(iii) Potential Fixation (GL=L level, CS=H level, ES=L level)

Figure 5:
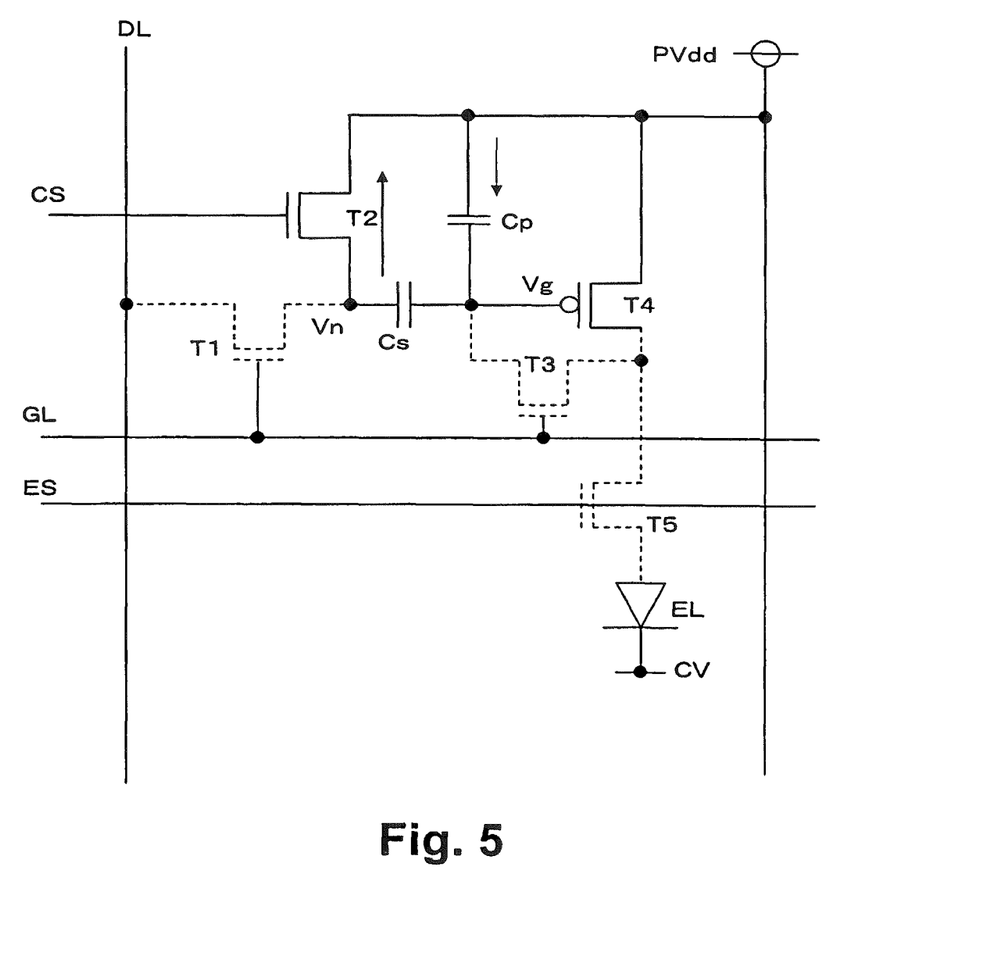
FIG. 5 is a diagram for illustrating a potential fixation process.

Next, the gate line GL is turned to the L level, and the selection transistor T1 and the short-circuit transistor T3 are turned off. After that, the capacitance setting line CS is tuned to the H level to turn on the potential control transistor T2. Consequently, as shown in FIG. 5, the gate of the drive transistor T4 is separated from the drain thereof. Moreover, because the potential control transistor T2 has been turned on, the potential Vn becomes the voltage PVdd. Consequently, the gate potential Vg of the drive transistor T4 is shifted according to the change of the potential Vn. In addition, because there is a parasitic capacitance Cp between the gate and the source of the drive transistor T4, the gate potential Vg is influenced by the parasitic capacitance Cp.

(iv) Light Emission (GL=L level, CS=H level, ES=H level)

Figure 6:
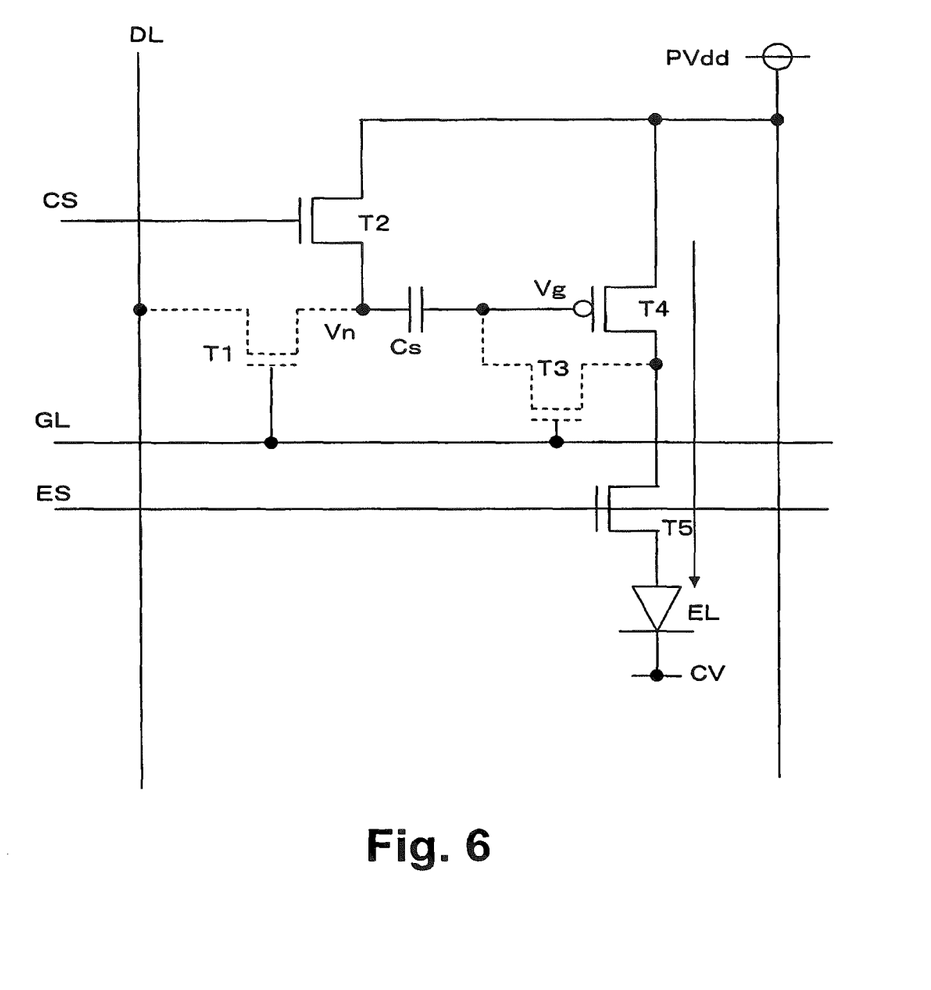
FIG. 6 is a diagram for illustrating a light emission process.

Next, the light emission setting line ES is turned to the H level, and consequently the drive control transistor T5 is turned on as shown in FIG. 6. As a result, the drive current from the drive transistor T4 flows in the organic EL element EL. The drive current at this time becomes the drain current of the drive transistor T4, which is determined by the gate voltage of the drive transistor T4, and the drain current becomes independent of the threshold voltage Vtp of the drive transistor T4 to makes it possible to suppress the variation in the light emission quantity caused by the variation of the threshold voltage Vtp.

Figure 7:
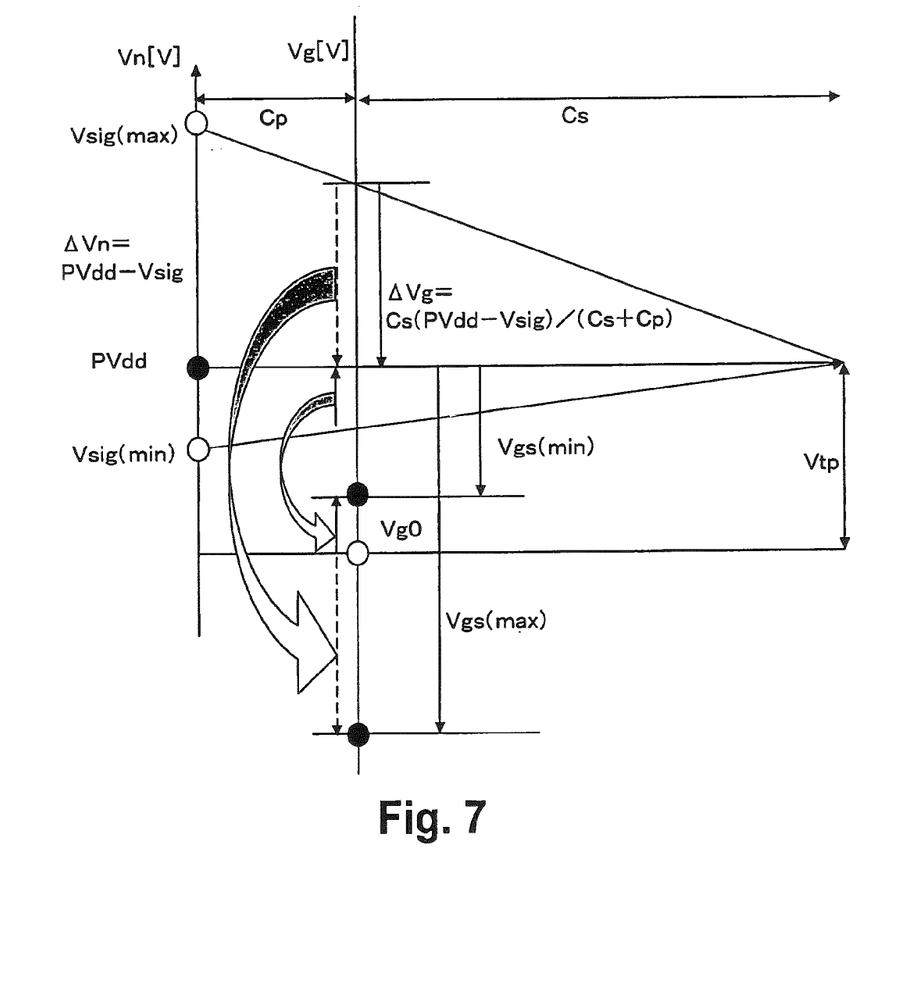
FIG. 7 is a diagram for illustrating a state of a potential change from a reset to the potential fixation process.

This fact is described with reference to FIG. 7.

As described above, after the (ii) reset, as shown indicated by white circles in marks O, the potential Vn (=Vsig) is a value between the voltages Vsig(max) and Vsig(min), and the potential Vg becomes a voltage Vg0 equal to the voltage PVdd from which the threshold voltage Vtp of the drive transistor T4 is subtracted. That is, Vg=Vg0=PVdd+Vtp (Vtp<0), Vn=Vsig.

Then, when the operation enters the (iii) potential fixation, the potential Vn changes from the voltage Vsig to the voltage PVdd, and consequently the variation ΔVg can be expressed as follows in consideration of the capacitances Cs and Cp: ΔVg=Cs(PVdd−Vsig)/(Cs+Cp).

Consequently, the values of the potential Vn and Vg become as follows as indicated by black circles • in the diagram: Vn=PVdd, Vg=Vtp+Δvg=PVdd+Vtp+Cs(PVdd−Vsig)/(Cs+Cp).

Now, because Vgs=Vg−PVdd, Vgs=Vtp+Cs(PVdd−Vsig)/(Cs+Cp).

On the other hand, the drain current I is expressed as follows: $I=(1/2)\beta(Vgs-Vtp)^2$, and by substituting the above expression, the drain current I can be expressed as follows:

$$I = (1/2)\beta\{Vtp + Cs(PVdd - Vsig)/(Cs + Cp) - Vtp\}^2$$
$$= (1/2)\beta\{Cs(PVdd - Vsig)/(Cs + Cp)\}^2$$
$$= (1/2)\beta\alpha(Vsig - PVdd)^2$$

where $\alpha=\{Cs/(Cs+Cp)\}^2$, β is the amplification factor of the drive transistor T4 and β=μ∈Gw/Gl, μ is carrier mobility, ∈ is a dielectric constant, Gw is a gate width, and Gl is a gate length.

As mentioned above, the expression of the drain current I does not include the voltage Vtp, and is proportional to the square of the voltage (Vsig−PVdd). Consequently, the influence of the threshold voltage of the drive transistor T4 can be excluded to achieve the light emission according to the data voltage Vsig.

Figure 8:
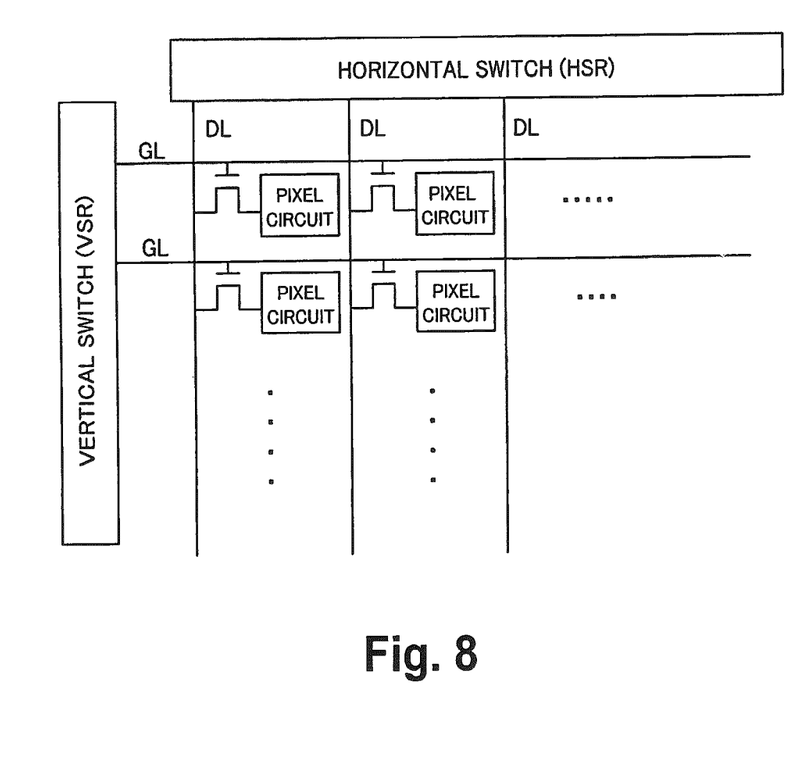
FIG. 8 is a diagram showing the overall configuration of a panel.

Only the operation of one pixel has been described above. In practice, pixels are arranged in a matrix on a display panel, the data voltage Vsig according to a corresponding luminance signal is supplied to each of the pixels to make each organic EL element emit light. That is, as shown in FIG. 8, a horizontal switch circuit HSR and a vertical switch circuit VSR are provided on a display panel, and the states of data lines DL, gate lines GL, light emission setting lines ES and the like are controlled by the outputs from the horizontal switch circuit HSR and the vertical switch circuit VSR. In particular, one gate line GL is associated with each pixel in a horizontal direction, and the gate lines GL are activated by the vertical switch circuit VSR one by one in order. Next, data voltages are supplied to all data lines DL during one horizontal period, during which one gate line GL is being activated, by a dot sequential system by the horizontal switch circuit HSR, and the supplied data voltages are written in the pixel circuits for the horizontal line. Then, respective pixel circuits perform light emission according to the data voltages which have been written in the pixel circuits until the end of one vertical period.

Figure 9:
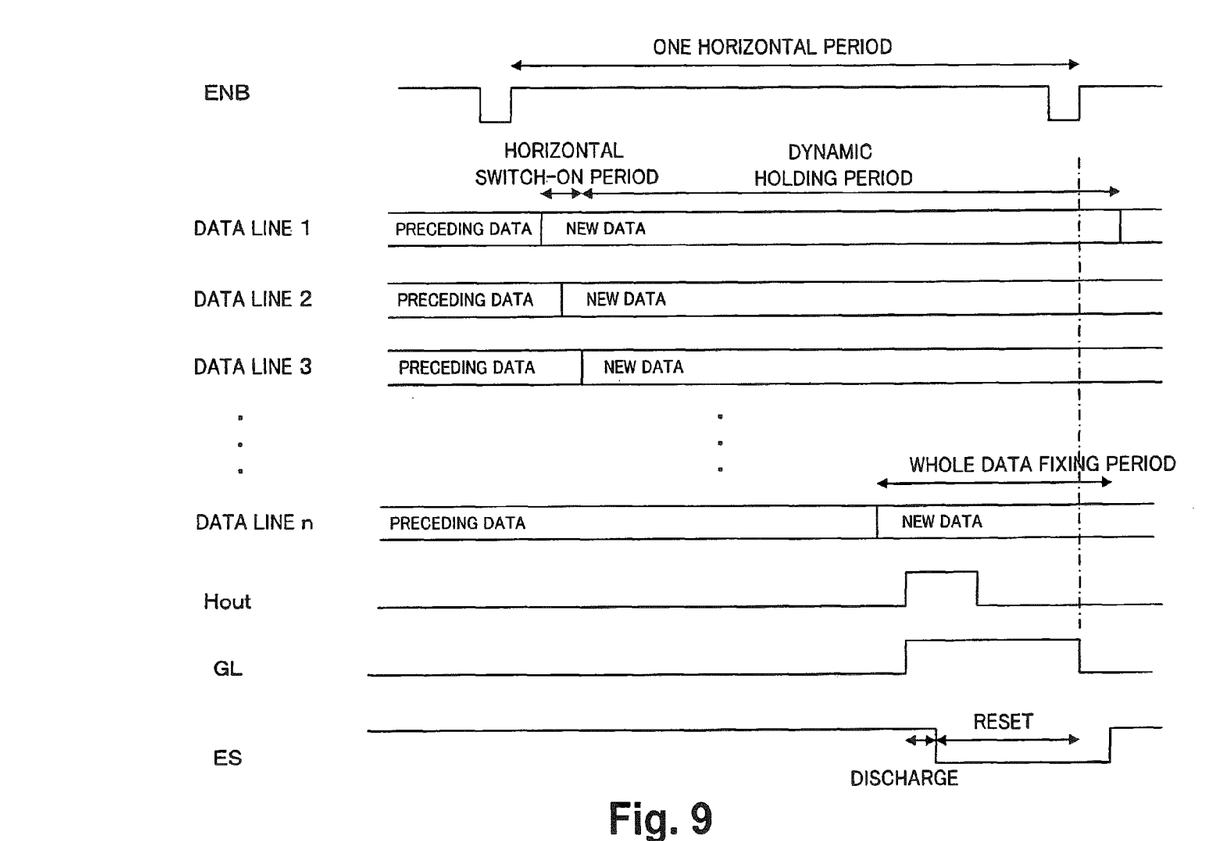
FIG. 9 is a diagram showing a timing example of data setting.

Next, the write procedure of data to each pixel on one horizontal line is described with reference to FIG. 9.

First, the data voltages Vsig are written in all of the data lines DL by the dot sequential system after the turning of an enable signal ENB to the L level, which indicates the start of one horizontal period. That is, a capacitance and the like is connected to a data line DL, and a data voltage Vsig is held by the data line DL by setting the voltage signal Vsig to the data line DL. Accordingly, by setting a data voltage Vsig pertaining to the pixel of each column to the corresponding data line DL sequentially, the data voltages Vsig are set on all of the data lines DL.

Then, at the stage of the end of the data setting, a voltage Hout is turned to the H level, and the gate lines GL are turned to the H level to be activated. Then, the operation of each pixel in the above one horizontal direction is performed, and the data to each pixel is written into each pixel to perform the light emission in the pixel.

In such a way, normal video signals (data voltages Vsig) are sequentially written to the data lines DL, and the written video signals are input to the pixel circuits to make it possible for them to perform light emission.

Figure 10:
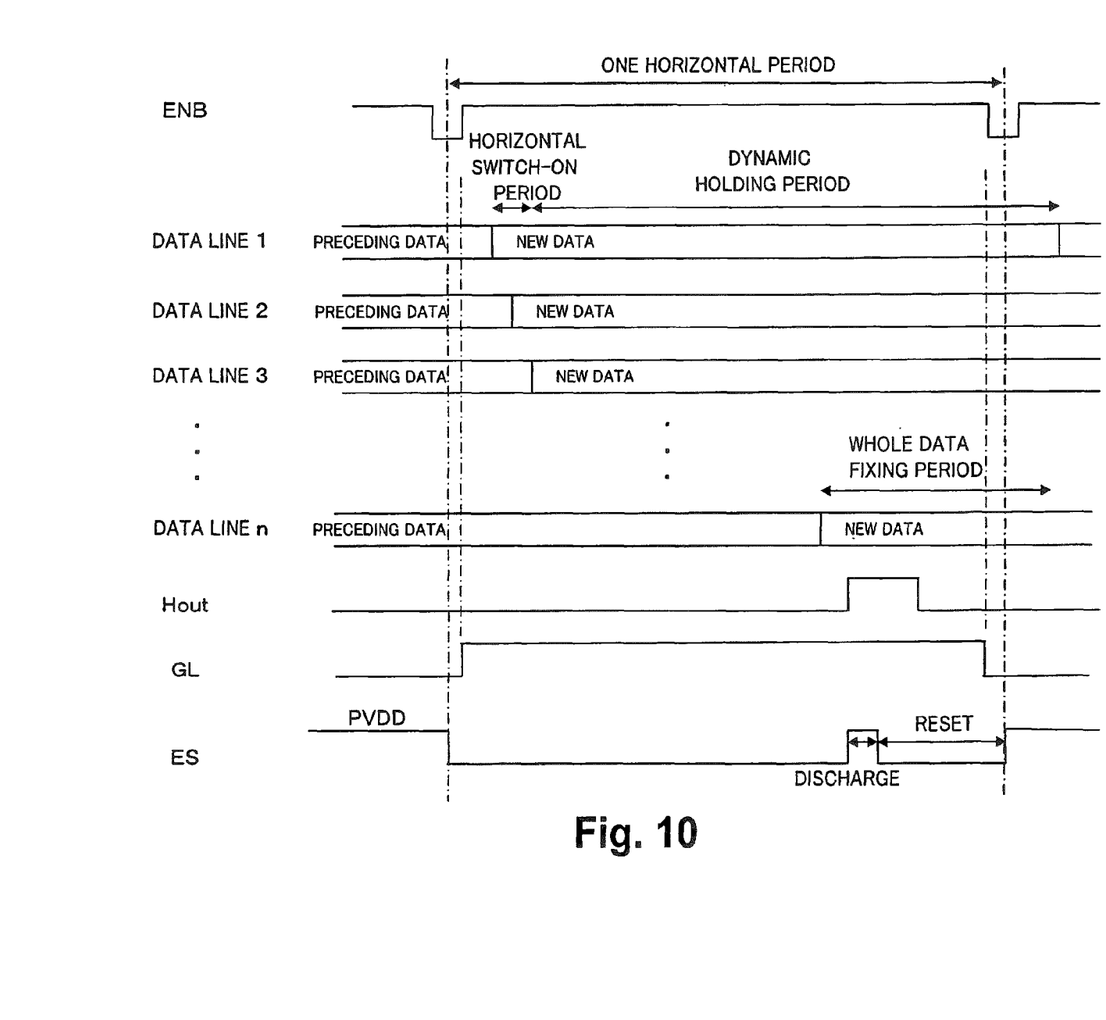
FIG. 10 is a diagram showing another timing example of data setting.

Next, another method is described with reference to FIG. 10. In the example, the light emission setting line ES is turned to the L level during the period in which the enable line ENB is at the L level, and the gate line GL is turned to the H level (activated) when the enable line ENB rises to be at the H level. In this state, the data voltages Vsig are sequentially set onto the data lines DL. Then, when the data voltages Vsig have been set on all the data lines DL, the light emission setting line ES is turned to the H level, and the above discharge is performed. After that, the light emission setting line ES is returned to the L level. The gate line GL is returned to the L level in synchronization with a fall of the enable line ENB, and the gate line GL is returned to the H level in synchronization with a rise of the enable line ENB. As a result, the operation similar to the one mentioned above is performed. In addition, the capacitance setting line CS is at the L level during the period in which the gate line GL is at the H level, and turns to the L level a little earlier than the rise of the gate line GL, and further returns to the H level a little later than the fall of the gate line GL.

Figure 11:
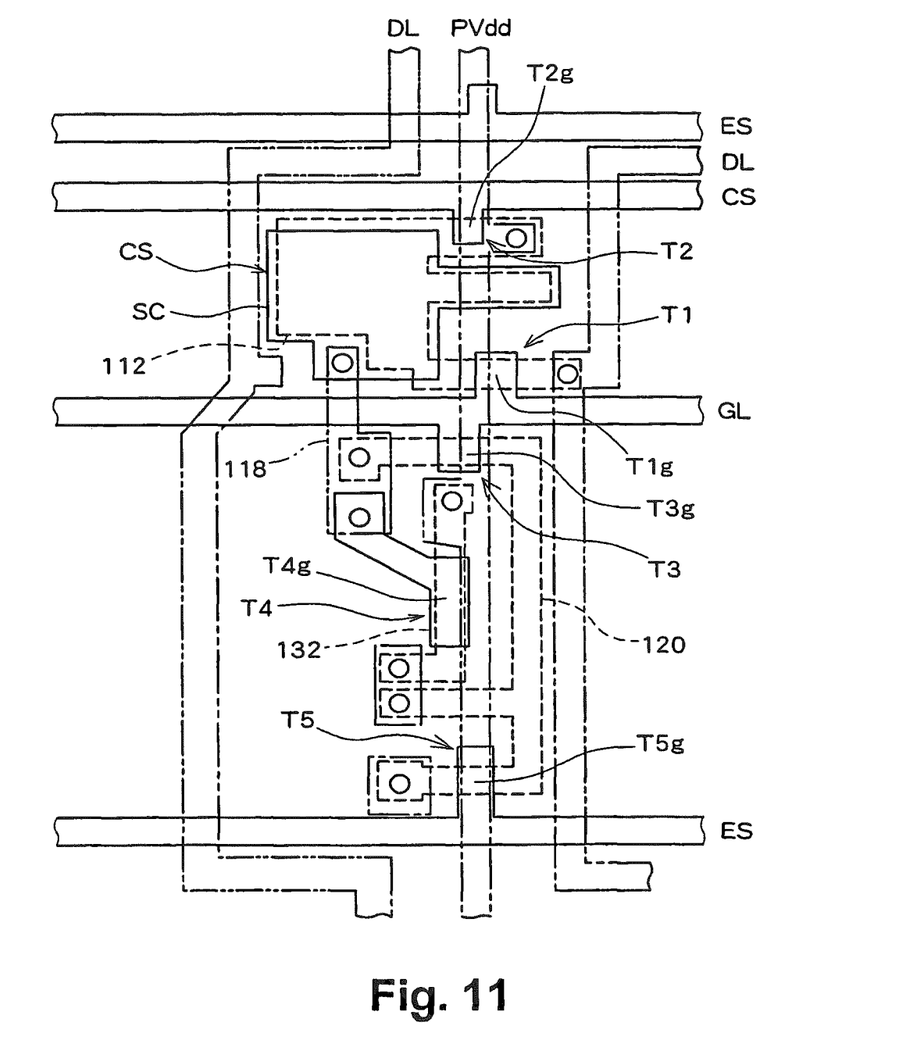
FIG. 11 is a view showing a layout of a pixel circuit according to the embodiment.

FIG. 11 shows a layout of a display panel using the pixel circuit shown in FIG. 1.

First, the capacitance setting line CS extends along the top end of the pixels of each row. In the pixel shown in the diagram, a data line DL extends on the right end part of each pixel in a column direction. Then, a power supply line PVdd extends almost parallel with each data line DL just on the left side thereof in the column direction. In addition, in the pixels on the stage below the shown pixel, the data line DL and the power supply line PVdd are disposed on the left end part of each pixel.

Moreover, a gate line GL extends to cross the pixel at a little upper part of the center of the pixel. Moreover, a light emission setting line ES is disposed along the bottom end of each pixel.

A projecting part is formed toward the upside at a part near to the right end of the pixel of the gate line GL, and the projecting part is used as a gate electrode T1g of the n-channel selection transistor T1. That is, a semiconductor layer 112 is formed below the gate electrode T1g in the thickness direction with a gate insulation film between them, and the semiconductor layer 112 extends along the gate line GL. The right end of the semiconductor layer 112 is connected to the data line DL with a contact.

Moreover, the semiconductor layer 112 extends in the left direction below the gate electrode T1g, and widens into almost a square into the direction of the capacitance setting line CS here. A capacitor electrode SC is provided in the same layer as the gate electrode, with the gate insulation film between the square part of the semiconductor layer 112 and the capacitor electrode. The area of the capacitor electrode SC and the semiconductor layer 112 sandwitching the gate insulation film therebetween functions as the capacitor Cs.

Moreover, a part of the semiconductor layer 112 constituting the capacitor Cs extends on the right side along the capacitance setting line CS, and is connected to the power supply line PVdd with a contact. Moreover, the projecting part from the capacitance setting line CS is located at an upper position in the thickness direction of the intermediate portion between the capacitor Cs side of the semiconductor layer 112 and the power supply line PVdd side, and the projecting part is located at the upper position in the thickness direction of semiconductor layer 112 with the gate insulation film put between them. The located portion is used as the n-channel potential control transistor T2.

A contact is formed just above the gate line GL at the center portion of the pixel of the capacitor Cs, and metal wiring 118 is connected by the contact. The metal wiring 118 reaches the part below the gate line GL with the gate line GL being passed, and is connected to a semiconductor layer 120 with a contact.

The semiconductor layer 120 extends to the right side, and after that extends toward the lower side between the data line DL and the power supply line PVdd along them, and a branch portion extending to the left side at the intermediate portion is formed. Then, the semiconductor layer 120 curves toward the left side before the light emission setting line ES. A projecting part extending from the gate line GL is provided at a position above a part extending into the right direction along the gate line GL of the semiconductor layer 120 in the thickness direction with the gate insulation film between them, and the projecting part is used as the gate electrode T3g of the n-channel short-circuit transistor T3. That is, the part constitutes the short-circuit transistor T3 connecting the gate with the source of the drive transistor T4.

The metal wiring 118 is connected to gate wiring in the same layer as that of the gate line GL with a contact below a contact connected to the short-circuit transistor T3, and the gate wiring extends in parallel with the power supply line PVdd. The extending gate wiring is used as the gate electrode T4g of the p-channel drive transistor T4. That is, a semiconductor layer 132 extending in the vertical direction is provided below the gate electrode T4g in the thickness direction with the gate insulation film put between them, and one end of the semiconductor layer 132 (drain: upper side in the view) is connected to the power supply line PVdd with a contact. The lower side of the semiconductor layer 132 in the view curves to the left side, and is then connected to the metal wiring with a contact. Furthermore, the metal wiring is connected to the branch portion extending to the left side from the intermediate portion of the semiconductor layer 120 with a contact.

Moreover, the bottom end of the semiconductor layer 120 extends to the left side along the light emission setting line ES. A part of the light emission setting line ES projects upwards and the part of the light emission setting line ES positioned above the bottom end of the semiconductor layer 120, with a gate insulation film being provided between them. The projected part of the light emission setting line ES functions as the gate electrode T5g of the n-channel drive control transistor T5. Here the drive control transistor T5 is formed. A pixel electrode is connected to the end on the left side of the lower end of the semiconductor layer 120 with a contact. Then, a cathode common to all pixels is formed at the upper part in the thickness direction of the pixel electrode with an organic light emission layer put between them to form an organic EL element.

In addition, in the thickness direction, a TFT is formed on a transparent substrate such as a glass plate, a transparent electrode (anode) for each pixel is formed on the TFT, and the cathode made of aluminum or the like, which is common to all the pixels, is formed above the transparent electrode with an organic light emission layer between them. As for the TFT, a buffer layer is formed on the glass substrate first, and several semiconductor layers 112, 120 and 132 are formed on the buffer layer at a predetermined position. A gate insulation film is formed to cover the semiconductor layers, and a gate line GL, a capacitor electrode and the like are formed of molybdenum, chromium or the like on the gate insulation film. An interlayer insulation film is formed to cover the layers of the gate line GL and the like. The metal (e.g. aluminum) wiring such as the power supply line PVdd, the data line DL and the like on the upper layer of the interlay insulation film is formed. Then, a flattening layer made of an acrylic resin or the like is formed to cover the metal wiring, and a transparent electrode (pixel electrode) made of ITO, IZO or the like is formed on the flattening layer.

As described above, according to the present embodiment, the capacitance setting line CS is disposed on the upper side of a pixel, and the light emission setting line ES is disposed on the lower side of the pixel in the view. The gate line GL is disposed at a position at a little lower side from the capacitance setting line CS.

With such an arrangement, the potential control transistor T2 and the selection transistor T1 can be arranged on the upper side of the gate line GL. In particular, by arranging the selection transistor T1 along the gate line GL, the projecting part of the gate line GL can be used as the gate electrode T1g of the selection transistor T1. On the other hand, because the potential control transistor T2 is formed along the capacitance setting line CS, the gate electrode T2g of the potential control transistor T2 can also be easily formed. Moreover, the contact of the potential control transistor T2 with the power supply line PVdd is also located at a corner of the pixel, which is an efficient arrangement. Then, the capacitor Cs can be formed in the space between the potential control transistor T2 and the selection transistor T1, and the space at the upper side of the gate line GL can be effectively used.

Moreover, because the short-circuit transistor T3 is disposed along the lower side of the gate line GL and the drive control transistor T5 is formed along the light emission setting line ES, the gate electrodes T3g and T5g of the short-circuit transistor T3 and the drive control transistor T5, respectively, can also be easily formed. Furthermore, the connection between the short-circuit transistor T3 and the drive control transistor T5 is made to be the semiconductor layer 120, and the semiconductor layer 120 is disposed on the lower side of the thickness direction in the space between the power supply line PVdd and the data line DL. Consequently, the influence of the wiring which is exerted on the aperture ratio can be reduced. Moreover, because the drive transistor T4 is disposed along the power supply line PVdd, the decrease of the aperture ratio is suppressed, giving an efficient arrangement.

Moreover, the layout as shown in FIG. 11 mentioned above can be similarly applied to the circuits as long as the circuits include two control lines in the horizontal direction besides the gate line. For example, the layout can also be applied to a circuit described in Published Japanese Translation of PCT Application No. 2002-514320.

What is claimed is:

1. A display apparatus including pixels arranged in a matrix, wherein each pixel includes:
- a first transistor having one end connected with a data line, the first transistor being turned on and off by a selection signal from a gate line to control reception of a data signal from the data line;
- a second transistor which is connected in series between a power source line and a light emitting device, the second transistor, when a voltage in accordance with the data signal received through the first transistor is applied thereto, causing a current from the power source line to flow through the light emitting device in accordance with the data signal;
- a third transistor which is turned on and off by application of the selection signal to a gate electrode of the third transistor from the gate line and is connected between a gate electrode of the second transistor and one end of the second transistor; and
- a fourth transistor which is connected in series between the power source line and the light emitting device, the fourth transistor being turned on and off by application of a signal to a gate electrode of the fourth transistor from a line which is provided as a common line for a row of pixels,
- wherein the third transistor and the fourth transistor are formed with a single continuous semiconductor layer which is provided to be opposed to the gate electrode of the third transistor and the gate electrode of the fourth transistor with an insulation film interposed therebetween, and the third transistor and the fourth transistor are connected with each other through the semiconductor layer.

2. The display apparatus according to claim 1, wherein the semiconductor layer that connects the third transistor and the fourth transistor is formed along the power source line or the data line within a display plane.

3. The display apparatus according to claim 1 wherein the semiconductor layer forming a channel region of the third transistor or the fourth transistor is formed so as to extend in parallel with the gate line.

4. The display apparatus according to claim 3 wherein the semiconductor layer forming a channel region of the third transistor and the fourth transistor is formed so as to extend in parallel with the gate line.

5. The display apparatus according to claim 1, wherein the gate of the second transistor is connected with a capacitor.

6. The display apparatus according to claim 5, wherein the capacitor includes a layer which is in the same layer as that of a semiconductor layer forming the second transistor and a layer which is in the same layer as that of a gate electrode of the second transistor, that are opposite each other.

7. The display apparatus according to claim 5, wherein the capacitor is partially superposed on the power source line.

8. The display apparatus according to claim 1, wherein said one end of the second transistor to which the third transistor is connected is a drain of the second transistor.

* * * * *